(12) United States Patent
Manohar et al.

(10) Patent No.: US 9,195,584 B2
(45) Date of Patent: Nov. 24, 2015

(54) DYNAMIC BLOCK LINKING WITH INDIVIDUALLY CONFIGURED PLANE PARAMETERS

(71) Applicant: SanDisk Technologies Inc., Plano, TX (US)

(72) Inventors: Abhijeet Manohar, San Jose, CA (US); Chris Nga Yee Avila, Saratoga, CA (US)

(73) Assignee: SanDisk Technologies Inc., Plano, TX (US)

( * ) Notice: Subject to any disclaimer, the term of this patent is extended or adjusted under 35 U.S.C. 154(b) by 269 days.

(21) Appl. No.: 13/741,252

(22) Filed: Jan. 14, 2013

(65) Prior Publication Data

US 2014/0164679 A1    Jun. 12, 2014

Related U.S. Application Data

(60) Provisional application No. 61/735,309, filed on Dec. 10, 2012.

(51) Int. Cl.
*G06F 12/02* (2006.01)
*G11C 16/34* (2006.01)

(52) U.S. Cl.
CPC ........ *G06F 12/0246* (2013.01); *G11C 16/3495* (2013.01); *Y02B 60/1225* (2013.01)

(58) Field of Classification Search
CPC .......................... G06F 12/0246; G06F 16/3495
USPC .......................................................... 711/103
See application file for complete search history.

(56) References Cited

U.S. PATENT DOCUMENTS

| | | | |
|---|---|---|---|
| 5,768,192 A | 6/1998 | Eitan | |
| 5,798,968 A | 8/1998 | Lee et al. | |
| 5,890,192 A | 3/1999 | Lee et al. | |
| 6,011,725 A | 1/2000 | Eitan | |
| 6,580,638 B2 | 6/2003 | Conley et al. | |
| 7,280,398 B1 | 10/2007 | Lee | |
| 7,433,993 B2 * | 10/2008 | Sinclair .................. | 711/103 |
| 2007/0076510 A1 | 4/2007 | Mangan et al. | |
| 2009/0157964 A1 | 6/2009 | Kasorla et al. | |
| 2012/0113721 A1 | 5/2012 | Kim | |

FOREIGN PATENT DOCUMENTS

WO    WO 02/058074    7/2002

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

\* cited by examiner

*Primary Examiner* — Yong Choe
(74) *Attorney, Agent, or Firm* — Davis Wright Tremaine LLP

(57) ABSTRACT

A multi-plane non-volatile memory die includes circuits that receive and apply different parameters to different planes while accessing planes in parallel so that different erase blocks are accessed using individualized parameters. Programming parameters, and read parameters can be modified on a block-by-block basis with modification based on the number of write-erase cycles or other factors.

19 Claims, 7 Drawing Sheets

DYNAMIC BLOCK LINKING WITH INDIVIDUALLY CONFIGURED PLANE PARAMETERS

The present application claims the benefit of U.S. Provisional Patent Application No. 61/735,309, filed on Dec. 10, 2012.

BACKGROUND

This application relates to the operation of re-programmable nonvolatile memory systems such as semiconductor flash memory systems, and, more specifically, to operation of multiple planes in such systems.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications. Conventional mass storage, based on rotating magnetic media such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card is ideally suited in the mobile and handheld environment because of its small size, low power consumption, high speed and high reliability features.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. In particular, flash memory such as Flash EEPROM allows entire blocks of memory cells to be erased at the same time.

Nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, Nov. 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

Memory cells of a typical flash EEPROM array are divided into discrete blocks of cells that are erased together. That is, the erase block is the erase unit, a minimum number of cells that are simultaneously erasable. Each erase block typically stores one or more pages of data, the page being the minimum unit of programming and reading, although more than one page may be programmed or read in parallel in different sub-arrays or planes. Each page typically stores one or more sectors of data, the size of the sector being defined by the host system. An example sector includes 512 bytes of user data, following a standard established with magnetic disk drives, plus some number of bytes of overhead information about the user data and/or the erase block in which they are stored.

In order to increase the degree of parallelism during programming user data into the memory array and read user data from it, the array is typically divided into sub-arrays, commonly referred to as planes, which contain their own data registers and other circuits to allow parallel operation such that sectors of data may be programmed to or read from each of several or all the planes simultaneously. An array on a single integrated circuit may be physically divided into planes, or each plane may be formed from a separate one or more integrated circuit chips. Examples of such a memory implementation are described in U.S. Pat. Nos. 5,798,968 and 5,890,192.

To further efficiently manage the memory, erase blocks may be linked together to form virtual blocks or metablocks. That is, each metablock is defined to include one erase block from each plane. Use of the metablock is described in international patent application publication no. WO 02/058074. The metablock is identified by a host logical block address as a destination for programming and reading data. Similarly, all erase blocks of a metablock are erased together. The controller in a memory system operated with such large blocks and/or metablocks performs a number of functions including the translation between logical block addresses (LBAs) received from a host, and physical block numbers (PBNs) within the memory cell array. Individual pages within the blocks are typically identified by offsets within the block address. Address translation often involves use of intermediate terms of a logical block number (LBN) and logical page.

In some cases, adaptive metablocks may link a variable number of erase blocks in an adaptive manner so that different blocks, in different planes, are linked together at different times. Examples of such adaptive metablocks are provided in U.S. Pat. No. 7,433,993.

In general, it is desirable to allow access to a number of erase blocks in different planes in parallel in a flexible manner, for example, to form adaptive metablocks. It is also desirable to maintain high speeds for such access.

SUMMARY

According to a general aspect of the invention, two or more planes in a flash memory die may be operated in parallel using different parameters in different planes. For example, blocks in different planes may have different hot counts and parameters for accessing blocks may be modified according to the hot count of the block being accessed. Where blocks being accessed in different planes in parallel have different access parameters, the parameters are separately loaded into die logic circuits and each plane is operated using the parameters for the block being accessed in that plane. Parameters may include programming voltages, number or programming pulses, read voltages, and other parameters used to access memory cells.

An example of an adaptable method of operating a flash memory die that includes two or more planes, includes: maintaining write-erase cycle counts for individual erase blocks in each of the two or more planes of the memory die; modifying operating parameters of individual erase blocks according to their respective write-erase cycle counts; and linking two or more individual erase blocks from different planes of the two or more planes of the memory die for parallel operation, the two or more individual erase blocks operated in parallel with different modified operating parameters based on their different respective write-erase cycle counts.

The different modified operating parameters may include different programming voltages applied to word lines during programming of the two or more individual erase blocks. The different modified operating parameters may include different numbers of pulses of programming voltages applied to word lines during programming of the two or more individual erase blocks. The different modified operating parameters may include different read voltages applied to word lines during programming of the two or more individual erase block.

An example of a multi-plane flash memory die includes: a plurality of nonvolatile memory cells arranged in a plurality of planes, a plane comprising a plurality of erase blocks; a write-erase cycle count circuit that maintains an individual write-erase cycle count for individual erase blocks of each plane; and memory accessing circuits that access two or more erase blocks in two or more of the plurality of planes in parallel using different parameters for each of the two or more erase blocks, the different parameters derived from individual write-erase cycle counts of the two or more erase blocks.

Memory accessing circuits may include programming circuits and the different parameters may include different program voltages. The memory accessing circuits may include programming circuits and the different parameters may include different numbers of programming pulses. The memory accessing circuits may include reading circuits and the different parameters may include different reading voltages. The multi-plane flash memory die may also include a read count circuit that maintains an individual read count for individual erase blocks of each plane. The different parameters derived from individual write-erase cycle counts of the two or more erase blocks may be further derived from individual read counts for the two or more erase blocks.

An example of an adaptable method of operating a flash memory die that includes two or more planes includes: maintaining historical usage information for individual erase blocks in each of the two or more planes of the memory die; modifying operating parameters of individual erase blocks according to their respective historical usage information; and linking two or more individual erase blocks from different planes of the two or more planes of the memory die for parallel operation, the two or more individual erase blocks operated in parallel with different modified operating parameters based on their different respective historical usages.

The historical usage information for an individual erase block may include an indication of the number of read operations performed on the individual erase block. The historical usage information for an individual erase block may include an indication of the number of write-erase cycles performed on the individual erase bock. The historical usage information for an individual erase block may include both an indication of the number of read operations and the number of write-erase cycles performed on the block. The different modified operating parameters may include different programming voltages. The different modified operating parameters may include different numbers of programming pulses. The different modified operating parameters may include different read voltages.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION

Memory System

Figure 1:
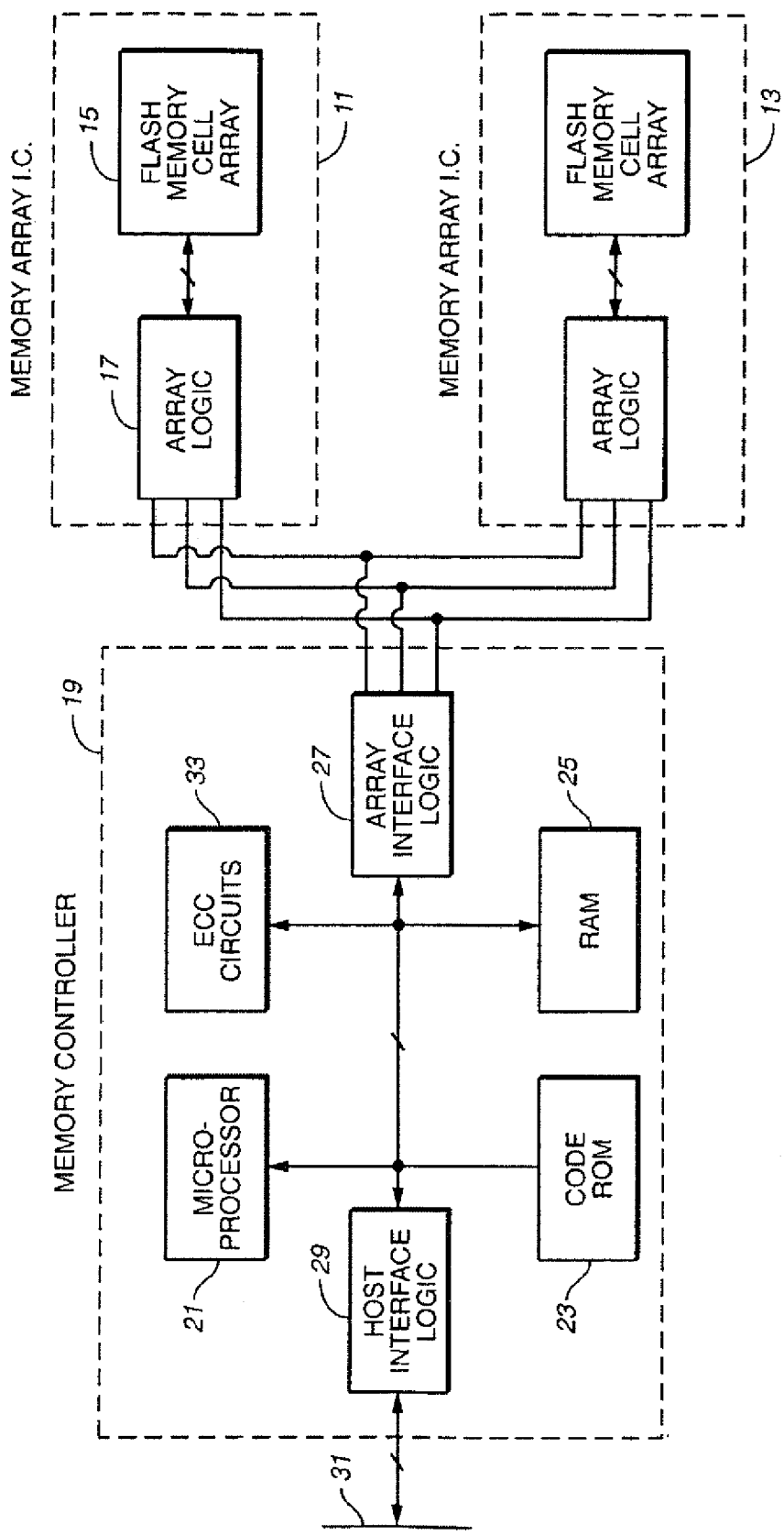
FIG. 1 illustrates schematically the main hardware components of a memory system suitable for implementing the present invention.

Referring initially to FIG. 1, a flash memory includes a memory cell array and a controller. In the example shown, two integrated circuit devices (chips) 11 and 13 include an array 15 of memory cells and various logic circuits 17. The logic circuits 17 interface with a controller 19 on a separate chip through data, command and status circuits, and also provide addressing, data transfer and sensing, and other support to the array 13. A number of memory array chips can be from one to many, depending upon the storage capacity provided. A memory cell array may be located on a single chip or may be comprised of memory cells on multiple chips. The controller and part or the entire array can alternatively be combined onto a single integrated circuit chip but this is currently not an economical alternative.

A typical controller 19 includes a microprocessor 21, a read-only-memory (ROM) 23 primarily to store firmware and a buffer memory (RAM) 25 primarily for the temporary storage of user data either being written to or read from the memory chips 11 and 13. Circuits 27 interface with the memory array chip(s) and circuits 29 interface with a host though connections 31. The integrity of data is in this example determined by calculating an ECC with circuits 33 dedicated to calculating the code. As user data is being transferred from the host to the flash memory array for storage, the circuit calculates an ECC from the data and the code is stored in the memory. When that user data are later read from the memory, they are again passed through the circuit 33, which calculates the ECC by the same algorithm and compares that code with the one calculated and stored with the data. If they compare, the integrity of the data is confirmed. If they differ, depending upon the specific ECC algorithm utilized, those bits in error, up to a number supported by the algorithm, can be identified and corrected.

The memory of FIG. 1 may be implemented as a small enclosed card containing the controller and all its memory array circuit devices in a faun that is removably connectable with a host. That is, connections 31 allow a card to be disconnected and moved to another host, or replaced by connecting another card to the host. Alternatively, the memory array devices may be enclosed in a separate card that is electrically and mechanically connectable with a card containing the controller and connections 31. As a further alternative, the memory of FIG. 1 may be embedded within a host, wherein the connections 31 and 31' are permanently made. In this case, the memory is usually contained within an enclosure of the host along with other components.

Figure 2:
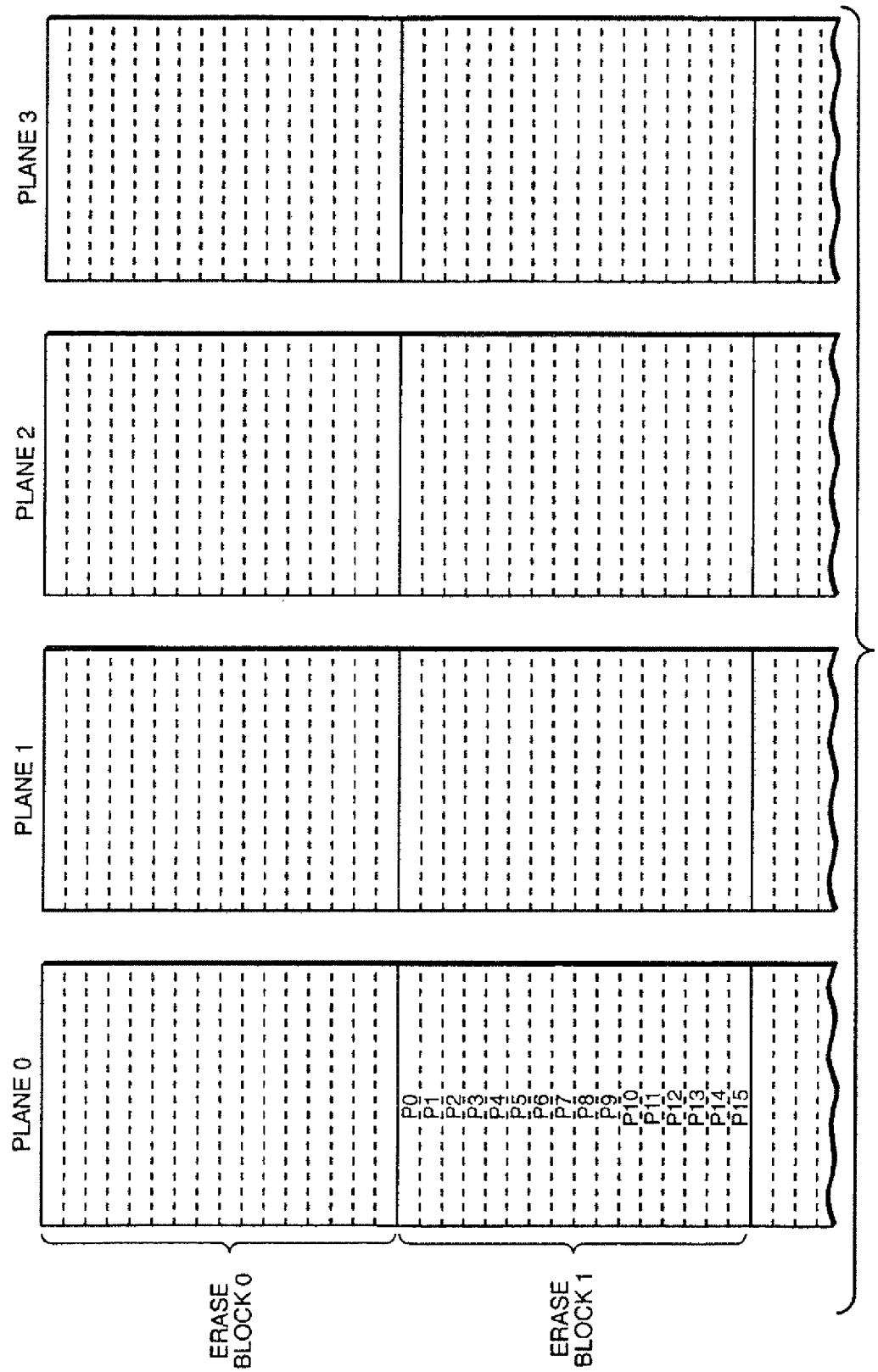
FIG. 2 illustrates a multi-plane memory array.

A portion of flash memory cell array 15 is shown in FIG. 2. Here, the memory cell array is physically divided into two or more planes, four planes 0-3 being illustrated. Each plane is a sub-array of memory cells that has its own data registers, sense amplifiers, addressing decoders and the like in order to be able to operate largely independently of the other planes. All the planes may be provided on a single integrated circuit device or on multiple devices, an example being to form each plane from one or more distinct integrated circuit devices. Each erase block in the example system of FIG. 2 contains 16 pages P0-P15, each page having a capacity of one, two or more host data sectors and some overhead data.

Figure 3:
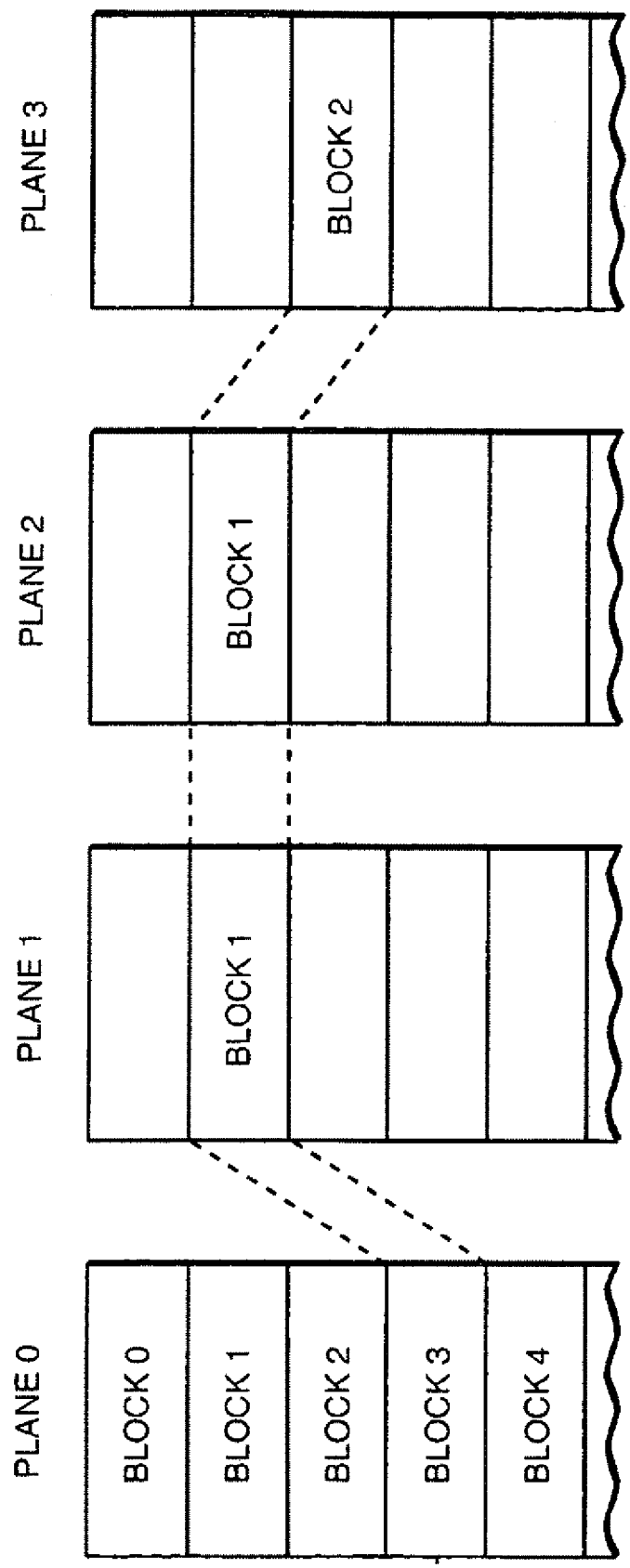
FIG. 3 illustrates formation of a metablock.

Another memory arrangement is illustrated in FIG. 3. Each plane contains a large number of erase blocks. In order to increase the degree of parallelism of operation, erase blocks within different planes are logically linked to form metablocks. One such metablock is illustrated in FIG. 3 by dashed lines showing logically linked blocks in different planes. Each metablock is logically addressable and the memory controller assigns and keeps track of the erase blocks that form the individual metablocks. The host system provides data in the form of a stream of sectors. This stream of sectors is divided into logical blocks. Here, a logical block is a logical unit of data that contains the same number of sectors of data as are contained in a metablock of the memory array. The memory controller maintains a record of the location where each logical block is stored. All blocks of the metablock are erased together, and pages from each block are generally programmed and read simultaneously.

In some examples, erase blocks are linked together to form metablocks in a static linking arrangement. For example, block 0 of each plane could be linked to form a metablock; block 1 of each plane could be similarly linked to form another metablock, etc. In other examples, erase blocks are linked together in dynamic manner so that different erase blocks may be linked at different times. Examples of such dynamic linking are provided in U.S. Pat. No. 7,433,993. While dynamic linking provides several advantages, it also presents certain problems.

One result of linking erase blocks dynamically is that erase blocks with very different characteristics may be linked. Where linking is static, a set of linked erase blocks such as a metablock all endure the same number of write-erase cycles and the same number of read or other operations. Because they all undergo the same wear patterns, they tend to have the same characteristics. When different erase blocks are linked at different times, two erase blocks with very different histories and very different characteristics may be linked, which may cause problems when accessing them in parallel.

In some cases, modified parameters are used to access an erase block as the erase block's characteristics change. For example, parameters used for reading, writing, and/or erasing may be modified based on the number of write-erase cycles ("hot count") and/or number of read operations. Carrying out such modification on a block-by-block basis presents particular challenges when accessing multiple erase blocks in parallel, in particular where such erase blocks are in different planes of the same memory die.

Figure 4A:
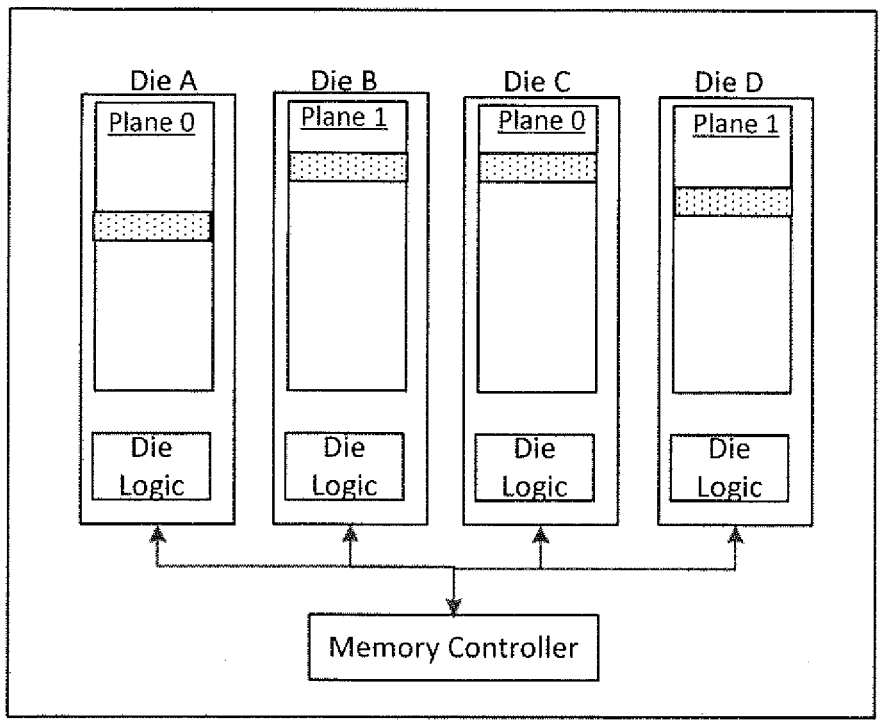
FIG. 4A illustrates a four-die memory array with one plane per die.

FIG. 4A shows the case of four planes, each in a different memory die. The shaded areas indicate particular erase blocks in each plane that are to be programmed in parallel. Because these erase blocks are dynamically linked, they do not have the same history, and have different programming parameters (e.g. programming voltages are different from erase block to erase block). Because each plane is in a different die, each has separate die logic circuits which allow parameters to be loaded and applied individually for each plane.

Figure 4B:
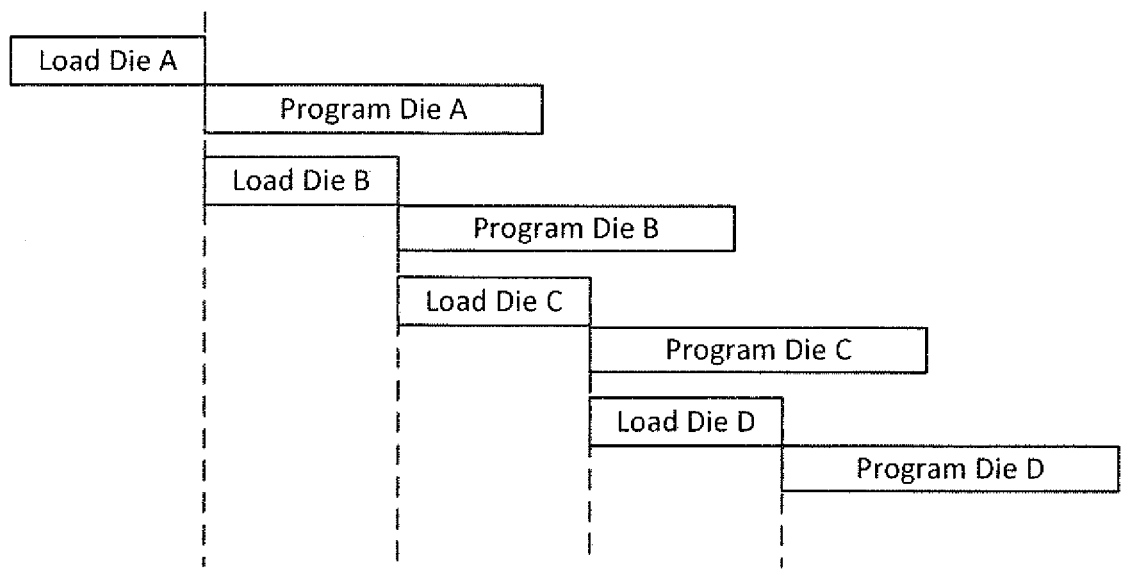
FIG. 4B is a timing diagram showing programming of the memory of FIG. 4A.

FIG. 4B shows how plane parameters may be individually modified and data may be programmed into the planes in parallel. First, parameters for the selected erase block of die A are loaded from the memory controller to the die logic which then uses the parameters to modify programming conditions for the selected erase block (e.g. change the program voltage from a default voltage to a modified voltage). Then, data to be programmed in die A is loaded (FIG. 4B shows a single time period "Load Die A" representing loading of parameters and subsequent loading of data). Programming the selected erase block is then performed in die A. While programming is performed in die A, parameters are loaded from the memory controller to the die logic in die B, which then uses the parameters to modify programming conditions. This may be a different modification to the modification in die A because of different history of the selected erase block. Data for die B is then loaded. While programming is performed in die B, parameters and data are loaded for die C. Similarly, while programming is performed in die C, parameters and data are loaded for die D. It will be understood that FIG. 4B is not to scale and that the time for programming is generally much longer than the time to load parameters.

Figure 5A:
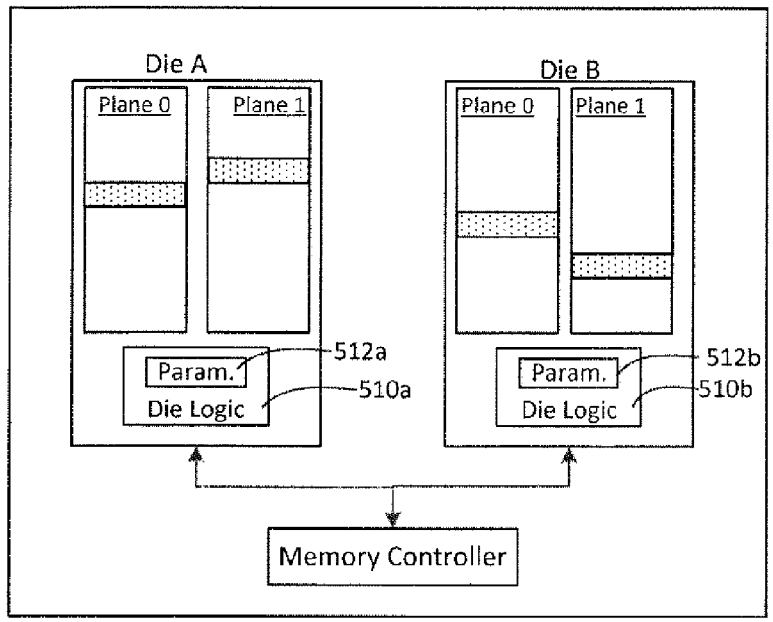
FIG. 5A illustrates a two die memory with two planes in each die.
Figure 5B:
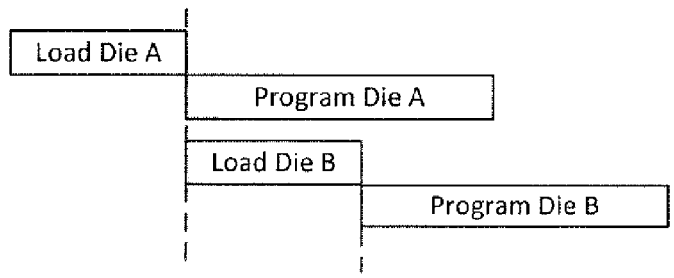
FIG. 5B is a timing diagram showing programming of the memory of FIG. 5A with the same parameters used for different planes of the same die.

FIG. 5A shows the case of two planes (plane 0, plane 1) in each of two dies (die A, die B). Die logic circuits 510a, 510b in each die receive and apply a set of parameters 512a, 512b for any given access operation. Where static linking is used within a die, each die just needs one set of parameters. Thus, as shown in FIG. 5B, parameters and data for die A are loaded, and programming of planes 0 and plane 1 of die A is performed. While programming is performed in die A, parameters and data are loaded for die B, and then programming of die B is performed in both plane 0 and plane 1 using the parameters.

In contrast to the static linking case, dynamically linked erase blocks within a die present certain problems. The same parameters may not be suitable for both planes because of the different histories of the erase blocks. If the same parameters are used for both planes, then reduced performance would be likely in at least one plane (parameters could only be optimized for one plane with the other plane having reduced performance).

Figure 5C:
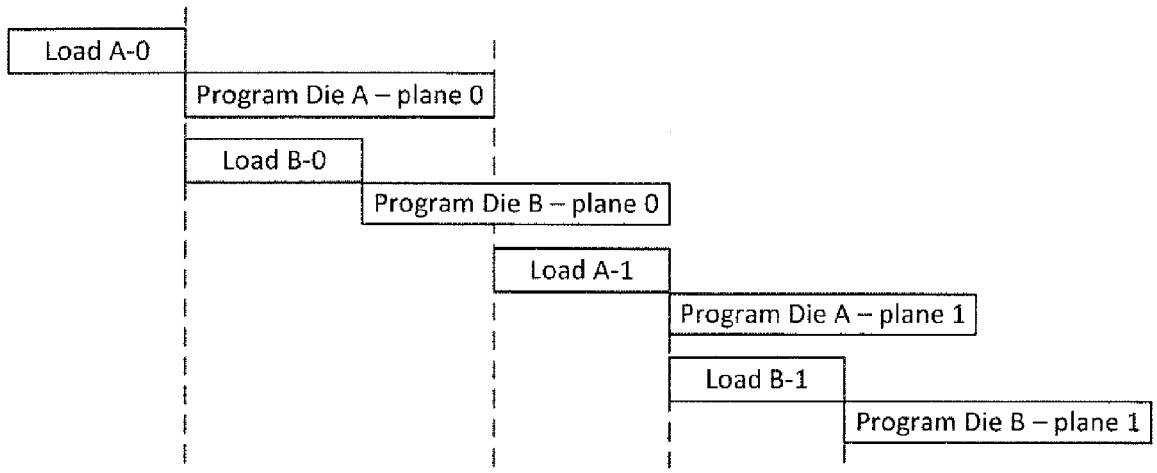
FIG. 5C is a timing diagram showing programming of the memory of FIG. 5A with different parameters used for different planes of the same die.

FIG. 5C shows one approach to such programming. First, appropriate parameters and data for die A, plane 0 are loaded. Then programming of die A, plane 0 is performed. While this programming is performed, parameters and data are loaded for die B, plane 0. Then programming of die B, plane 0 begins. The system then waits until completion of programming in die A (assertion of ready flag). When programming of die A, plane 0 is complete, parameters and data for die A, plane 1 are loaded to die logic for die A. Programming of die A, plane 1 is then performed using these parameters. When programming of die B, plane 0 is complete, parameters and data for die B, plane 1 are loaded to die logic for die B. Programming of die B, plane 1 is then performed. Because planes within a given die are programmed sequentially, not in parallel, this approach is not efficient and requires more than twice as long as a programming operation because of the sequential programming of planes within each die (i.e. time>2*Tprog, where Tprog is time for a programming operation). This is in contrast with the examples of FIGS. 4B and 5B which show substantially parallel programming of all planes with a total time that is little more than Tprog.

Figure 6A:
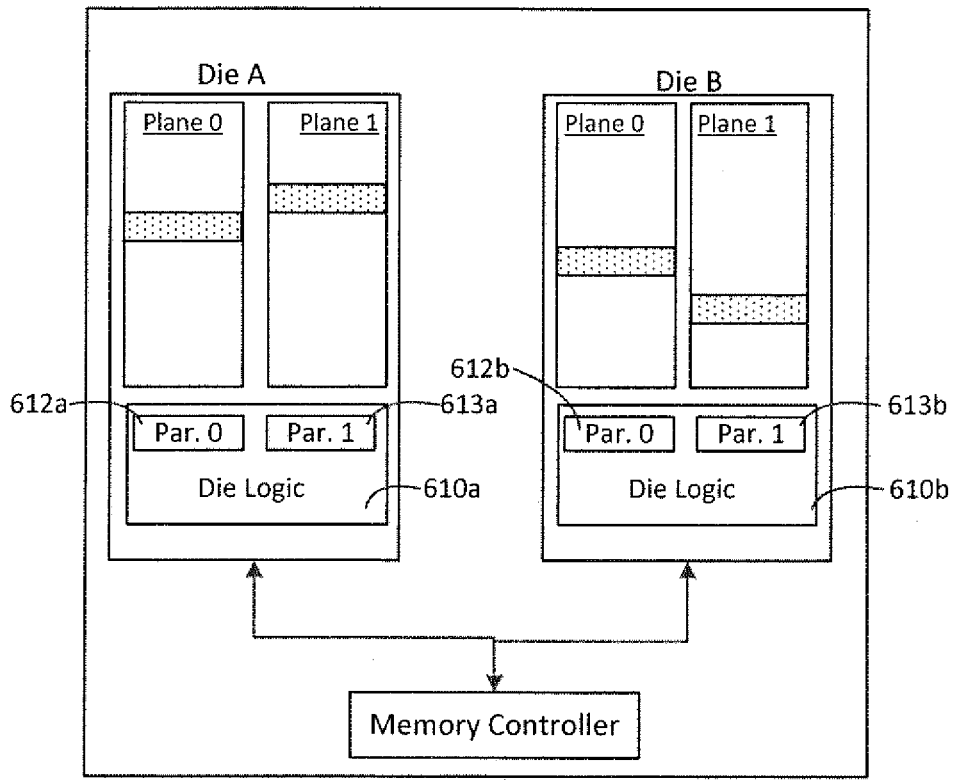
FIG. 6A illustrates a two die memory with two planes in each die and with die logic circuits that store and apply different parameters for each plane in a die.

FIG. 6A shows an example of a memory according to an embodiment in which die logic circuits 610*a*, 610*b* are modified to receive and store different parameters for each plane (i.e. different parameters for plane 0 and plane 1). In die A, a set of parameters 612*a* are received and applied to plane 0, and a different set of parameters 613*a* are received and applied to plane 1. In die B, a set of parameters 612*b* are received and applied to plane 0, and a different set of parameters 613*b* are received and applied to plane 1. A memory controller sends parameters to the die logic of a particular die for each plane in the die that is to be programmed. The die logic then stores the parameters and makes appropriate modification to any accessing operation. For example, programming voltages may be modified differently so that plane 0 uses one programming voltage while plane 2 uses a different programming voltage during parallel programming. In other examples, other programming parameters such as the number of programming pulses may be different between planes in the same die.

Figure 6B:
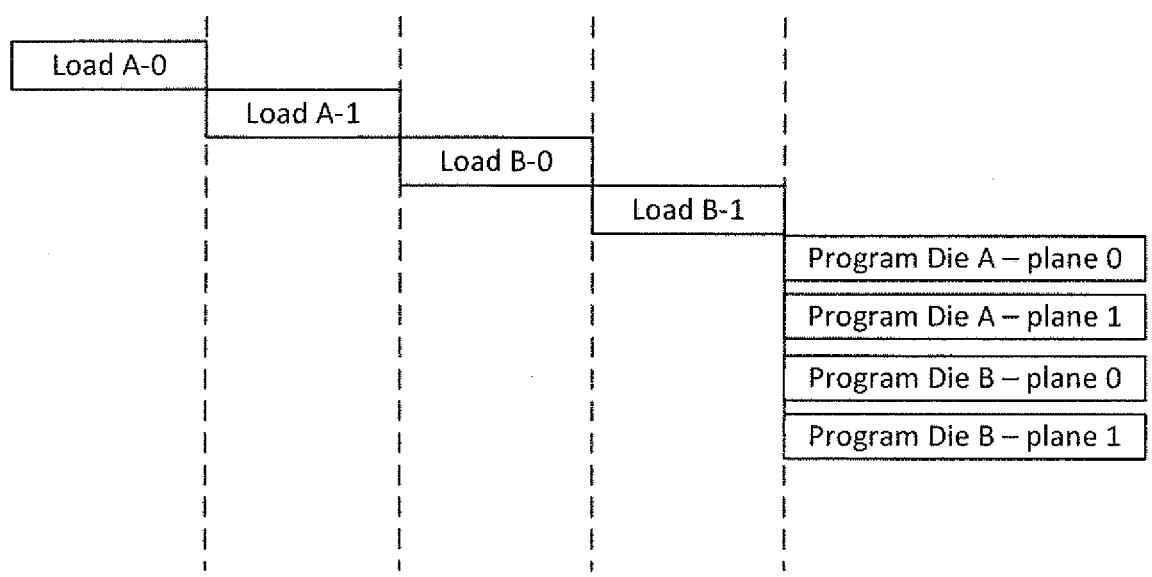
FIG. 6B is a timing diagram for parallel programming of the memory of FIG. 6A.

FIG. 6B shows a timing diagram for operation of the memory of FIG. 6A. First, parameters and data are loaded for die A, plane 0. Then parameters and data are loaded for die A, plane 1. Then for die B, plane 0. Then for die B, plane 1. When all parameters and data are loaded for the planes to be accessed, programming is performed in all planes in both dies in parallel. While loading is performed in series, the much longer programming steps are performed in parallel thus producing a significant time saving. While the example of FIG. 5C required more than twice the programming time (2*Tprog+loading time), the example of FIG. 6B requires little more than one programming time (Tprog+loading time). Because the programming time is much greater than the loading time, this may save close to half the total time.

While the above examples refer to a program operation that is directed to two planes within a die, aspects of the present invention are not limited to such examples. Aspects of the present invention may be applied to any number of planes in a die and may provide more time saving where a greater number of planes are accessed in parallel (as compared with time for serial access to the same number of planes).

Aspects of the present invention apply to other accessing operations in addition to programming. For example parameters used for read operations may also be modified on a block by block basis and such parameters may be separately loaded and applied in parallel in different planes of a die. In one example, the read voltage that is applied to a selected word line during a read operation is modified on a block by block basis. Two different blocks in different planes of the same die may be read in parallel using different read voltages according to an aspect of the present invention.

While access parameters for program, read, or erase operations may be modified on a block-by-block basis in response to the blocks' hot counts, this is not the only factor that may be used. For example, in some cases data may be affected by a large number of read operations so that even though the hot count remains the same for a particular block, read parameters may be modified as the number of read operations increases. Schemes for applying different parameters may also be based on locations of particular blocks within a memory array where there are known patterns in characteristics of blocks as a function of their locations. In other examples, experimentally observed differences between characteristics of different blocks may be used to obtain individual parameters for blocks without necessarily linking such individual parameters to any particular mechanism that might cause the differences. In some examples, a scheme for applying different parameters may be based on a combination of factors rather than a single factor.

Figure 7:
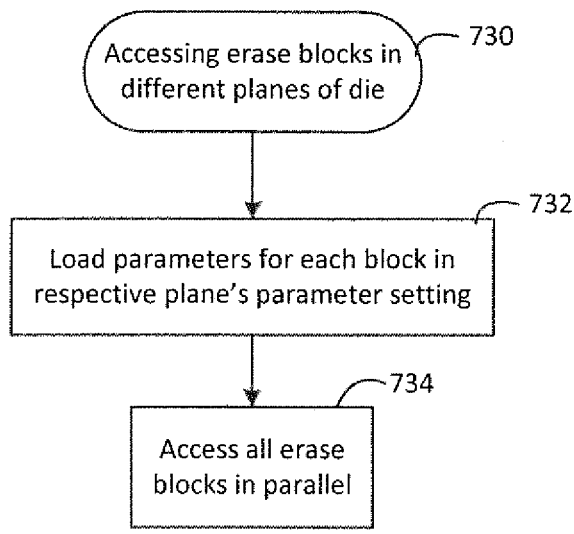
FIG. 7 illustrates a scheme for accessing erase blocks in different planes of the same die using different parameters.

FIG. 7 shows a flowchart for accessing different planes in a die in parallel 730. Accessing may include programming or reading. Accessing parameters (e.g. programming parameters, or read parameters) are loaded 732 from the memory controller to the die logic circuits for each plane that is to be accessed. The parameters may be based on hot counts of the individual erase blocks that are to be accessed or may be based on another factor, or some combination of factors. When individual parameters are loaded for all planes that are to be accessed, then all planes are accessed in parallel 734 using their individual parameters (e.g. different reading, programming, voltages).

Conclusion

The foregoing detailed description has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. An adaptable method of operating a flash memory die that includes two or more planes, comprising:
   maintaining write-erase cycle counts for individual erase blocks in each of the two or more planes of the memory die;
   modifying operating parameters of individual erase blocks according to their respective write-erase cycle counts; and
   linking two or more individual erase blocks from different planes of the two or more planes of the memory die for parallel operation, the two or more individual erase blocks operated in parallel with different modified operating parameters based on their different respective write-erase cycle counts.

2. The adaptable method of claim 1 wherein the different modified operating parameters include a first programming voltage applied to word lines of a first block of the two or more individual erase blocks and a second programming voltage applied to word lines of a second block of the two or more individual erase blocks during programming of the two or more individual erase blocks.

3. The adaptable method of claim 1 wherein the different modified operating parameters include a first number of pulses of programming voltages applied to word lines of a first block of the two or more individual erase blocks and a second number of pulses of programming voltages applied to word lines of a second block of the two or more individual erase blocks during programming of the two or more individual erase blocks.

4. The adaptable method of claim 1 wherein the different modified operating parameters include a first read voltage applied to word lines of a first block of the two or more individual erase blocks and a second read voltage applied to word lines of a second block of the two or more individual erase blocks during programming of the two or more individual erase block.

5. The adaptable method of claim 1 wherein operation of the two or more individual erase blocks in parallel comprises:
    loading first parameters and data for a first plane of the two or more planes;
    subsequently, loading second parameters and data for a second plane of the two or more planes;
    subsequently, programming data in the first plane using the first parameters and in the second plane using the second parameters in parallel.

6. The adaptable method of claim 5 wherein the programming is performed only after all parameters and data have been loaded sequentially for all planes to be programmed.

7. A multi-plane flash memory die comprising:
    a plurality of nonvolatile memory cells arranged in a plurality of planes, a plane comprising a plurality of erase blocks;
    a write-erase cycle count circuit that maintains an individual write-erase cycle count for individual erase blocks of each plane; and
    memory accessing circuits that access two or more erase blocks in two or more of the plurality of planes in parallel using different parameters for each of the two or more erase blocks, the different parameters derived from individual write-erase cycle counts of the two or more erase blocks.

8. The multi-plane flash memory die of claim 7 wherein the memory accessing circuits include programming circuits and the different parameters include different program voltages.

9. The multi-plane flash memory die of claim 7 wherein the memory accessing circuits include programming circuits and the different parameters include different numbers of programming pulses.

10. The multi-plane flash memory die of claim 7 wherein the memory accessing circuits include reading circuits and the different parameters include different reading voltages.

11. The multi-plane flash memory die of claim 7 further comprising a read count circuit that maintains an individual read count for individual erase blocks of each plane.

12. The multi-plane flash memory die of claim 11 wherein the different parameters derived from individual write-erase cycle counts of the two or more erase blocks are further derived from individual read counts for the two or more erase blocks.

13. An adaptable method of operating a flash memory die that includes two or more planes, comprising:
    maintaining historical usage information for individual erase blocks in each of the two or more planes of the memory die;
    modifying operating parameters of individual erase blocks according to their respective historical usage information; and
    linking two or more individual erase blocks from different planes of the two or more planes of the memory die for parallel operation, the two or more individual erase blocks operated in parallel with different modified operating parameters based on their different respective historical usages.

14. The adaptable method of claim 13 wherein the historical usage information for an individual erase block includes an indication of the number of read operations performed on the individual erase block.

15. The adaptable method of claim 13 wherein the historical usage information for an individual erase block includes an indication of the number of write-erase cycles performed on the individual erase bock.

16. The adaptable method of claim 13 wherein the historical usage information for an individual erase block includes both an indication of the number of read operations and the number of write-erase cycles performed on the block.

17. The adaptable method of claim 13 wherein the different modified operating parameters include different programming voltages.

18. The adaptable method of claim 13 wherein the different modified operating parameters include different numbers of programming pulses.

19. The adaptable method of claim 13 wherein the different modified operating parameters include different read voltages.

* * * * *